Mayfield

[11] 3,975,682
[45] Aug. 17, 1976

[54] WATT/WATTHOUR TRANSDUCER AND INTEGRATOR AND CURRENT SOURCES THEREFOR

[75] Inventor: Glenn A. Mayfield, Columbus, Ohio

[73] Assignee: Esterline Corporation, New York, N.Y.

[22] Filed: Dec. 13, 1974

[21] Appl. No.: 532,530

[52] U.S. Cl. .................................................. 324/142
[51] Int. Cl.² .............................................. G01R 21/00
[58] Field of Search ................................... 324/142

[56] References Cited
UNITED STATES PATENTS

| | | | |
|---|---|---|---|
| 3,470,471 | 9/1969 | Moore | 324/142 |
| 3,731,190 | 5/1973 | Schwendtner | 324/142 |
| 3,775,683 | 11/1973 | Barta et al. | 324/142 |
| 3,794,917 | 2/1974 | Martin et al. | 324/142 |

Primary Examiner—Gerard R. Strecker
Attorney, Agent, or Firm—Frank H. Foster

[57] ABSTRACT

A watt/watthour meter of improved accuracy and relatively lower cost than a conventionally designed device with similar specifications. A current proportional to instantaneous power is obtained from a current-voltage multiplier circuit and is maintained as a current signal through amplifying and filtering and through the watt output load and through integrating in the watthour section. The watthour integrator uses a charge compensation integrator circuit to integrate one of the watt signal currents and it can integrate in either direction corresponding to power in or power out. This can be accomplished because circuitry is disclosed to provide a current pulse having a precise magnitude and in either of two alternative, opposite current flow directions. The magnitude of the current pulse in both directions is referenced from the same reference voltage and reference resistance and its duration is referenced from the same timer so that an identical quantum of charge may be either added to or removed from the integrator depending upon the direction of power flow.

5 Claims, 5 Drawing Figures

WATT/WATTHOUR TRANSDUCER AND INTEGRATOR AND CURRENT SOURCES THEREFOR

BACKGROUND AND OBJECTS OF THE INVENTION

The present invention relates generally to electrical power instrumentation and more particularly relates to a watt/watthour transducer for metering the rate and quantity of electrical energy transmission.

The conventional watt/watthour metering apparatus which is related to the present invention typically has voltage and current input scaling means for providing a signal proportional to power line voltage and a signal proportional to power line current. These signals are applied to a multiplier circuit which provides an output signal having a value substantially proportional to the power or rate of energy flow through the power line.

Some systems, such as that shown in U.S. Pat. No. 3,794,917 have a multiplier which includes a pulse width modulating circuit. In such a circuit, one of the input signals or a signal proportional thereto is modulated by the other input signal or a signal proportional thereto. The output of such a pulse width modulator arrangement consists of a series of pulses having a height proportional to the instantaneous value of either the current or voltage in the power line and having a pulse width proportional to the instantaneous value of the other.

The average value of this series of pulses is proportional to the average instantaneous power of the power line. Consequently, the output of the modulator may be filtered and amplified to provide an output signal indicative of instantaneous power (actually power averaged over a very small time interval dependent upon the response time of the system which is typically less than a few seconds).

In addition, a signal proportional to the modulator output signal or the modulated output signal itself may be integrated with respect to time to provide a signal corresponding to watthours of energy through the power line over a given time interval. The present invention relates to improvements in watt/watthour metering apparatus.

It is conventional in a circuit of the above type to utilize voltage signals and voltage devices. This means that the information contained at various points in the circuitry is related to the voltage between particular nodes rather than to the current flow.

It is typical in the integrating section of the watt/watthour meter to provide circuitry which not only integrates the watt related signal with respect to time but quantizes the signal into a series of countable output pulses each pulse indicating a unit of power line energy. Such pulses may conveniently be counted or accumulated in a suitable register or counting device to indicate the total energy through the power line.

One problem with such conventional circuits, which depend upon one or more voltage signals, is that the offset voltages of typical op-amps, drift and the voltage drops across various circuit elements cause considerable error. This error is a particular problem in equipment for which error tolerances must be kept within a percentage of reading rather than within a percentage of full scale because a small offset error may be a major portion of a small reading. In fact, because of offset error one leader in the field has declared a charge compensation integrator to be unsuitable for watthour circuitry.

It is therefore an object of the invention to eliminate such voltage related error and to greatly improve the percent of reading accuracy of a watt/watthour transducer.

It is conventional in the integrating portion of the conventional watthour apparatus that the integrating circuit always operates in the same direction and that other circuitry is provided for detecting the direction of power flow. The latter circuit is sometimes referred to as power in-power out detector. The terms "in" and "out" are used equivalently to "import" and "export" or "forward" and "reverse" when referring to the direction of power flow. Circuitry is conventionally provided which reverses the signal input to the integrating circuit when the power flow direction reverses so that the integrator can always run in the same direction. The output is then steered to the appropriate counter. The power in-power out detector controls the direction of the input signal and the steering of the output. However, the signal reversing circuits introduce error because their two states are not identical.

Therefore, it is an object of the present invention to provide an integrating circuit which can integrate in either a forward or reverse direction; that is, which can integrate a watt related signal which is proportional in both amplitude and direction to the power flow through the power line being monitored.

A charge compensation integrator circuit is an integrator which has previously been used for other applications. It is also known as a "charge balance", "charge dispensing" or "charge conservation" integrator. In a conventional charge compensation integrator, an integrator circuit is charged by the signal to be integrated. Thus, the input signal may for example insert charge into the capacitor of the integrator. When the total charge reaches a selected level a precise charge quantum is removed or dumped from the integrator by other circuitry. Consequently, the number of times the precise quantum of charge is removed is an indication of total energy through the power line. A pulse may therefore be derived each time a quantum of charge is removed and these pulses can be counted or accumulated to indicate the total time integral of the watt input signal.

However, in conventional circuits, integration is done in only one direction. This means that if the watt signal places charge into the integrator the other circuitry takes charge out. For a particular conventional circuit these roles can not be reversed. The watt signal can not also take charge out with the other circuitry putting in a precise quantum of charge to produce oppositely directed pulses which can be counted.

Therefore another object of the invention is to provide a charge compensation integrator which is capable of inserting or removing equally precise countable quanta of charge into or out of a charge compensation integrator, so that the integrator can integrate in either direction.

The need for such an integrator requires the existence of a source which can provide current pulses having a very precise magnitude and width. Furthermore, a bi-directional source is required which can provide such current pulses in either direction.

Conventionally, a current source which can be sunk to virtual ground is obtained by tying a zener voltage reference diode either to the +V or −V terminal of a power supply and connecting its other end through a resistor to ground. A current source is then connected to a reference from that diode. Although this works well for providing a single current source, it is difficult to use such a zener diode for referencing other current sources and for referencing other cirucits within a watt-/watthour transducer.

Accordingly, it is another object of the present invention to provide a circuit capable of producing a current pulse of precise magnitude.

Still another object of the present invention is to provide a bipolar current source which can provide current pulses in either of two directions with the pulses in either direction having identical magnitudes determined by the same single reference voltage and the same single resistance.

It is another object of the present invention to provide such a current source which utilizes a single zener-derived reference voltage which is referenced to ground so that it can be used for referencing a variety of other circuits in the watt/watthour transducer.

Further objects and features of the present invention will be apparent from the following specification and claims when considered in connection with the accompanying drawings illustrating the preferred embodiments of the invention.

SUMMARY OF THE INVENTION

The invention has a watt/watthour transducer in which a high impedance current source proportional to the voltage or current in a power line is pulse width modulated to provide an output current proportional to instantaneous power in the power line which is integrated by a bidirectional integrator to provide a watthour output. A precision standard current source referenced to a reference voltage and a reference resistance is obtained from a controllable current source which is controlled by an integrator circuit which continuously integrates the difference between the reference potential and the potential at the reference resistance. Periodically, the current source is borrowed by a switching means which switches the current source to an external load such as a watthour integrator section and disables the controlling integrator circuit to prevent integration while the current source is borrowed. This circuit is useful for providing a bipolar current source capable of supplying a current pulse having a standard selected magnitude referenced to a single reference voltage and a single reference resistance and directed in either of two opposite flow directions. This bipolar standard current source is useful with a charge compensation integrator circuit capable of integrating the watt signal for power in and power out.

Figure 1:
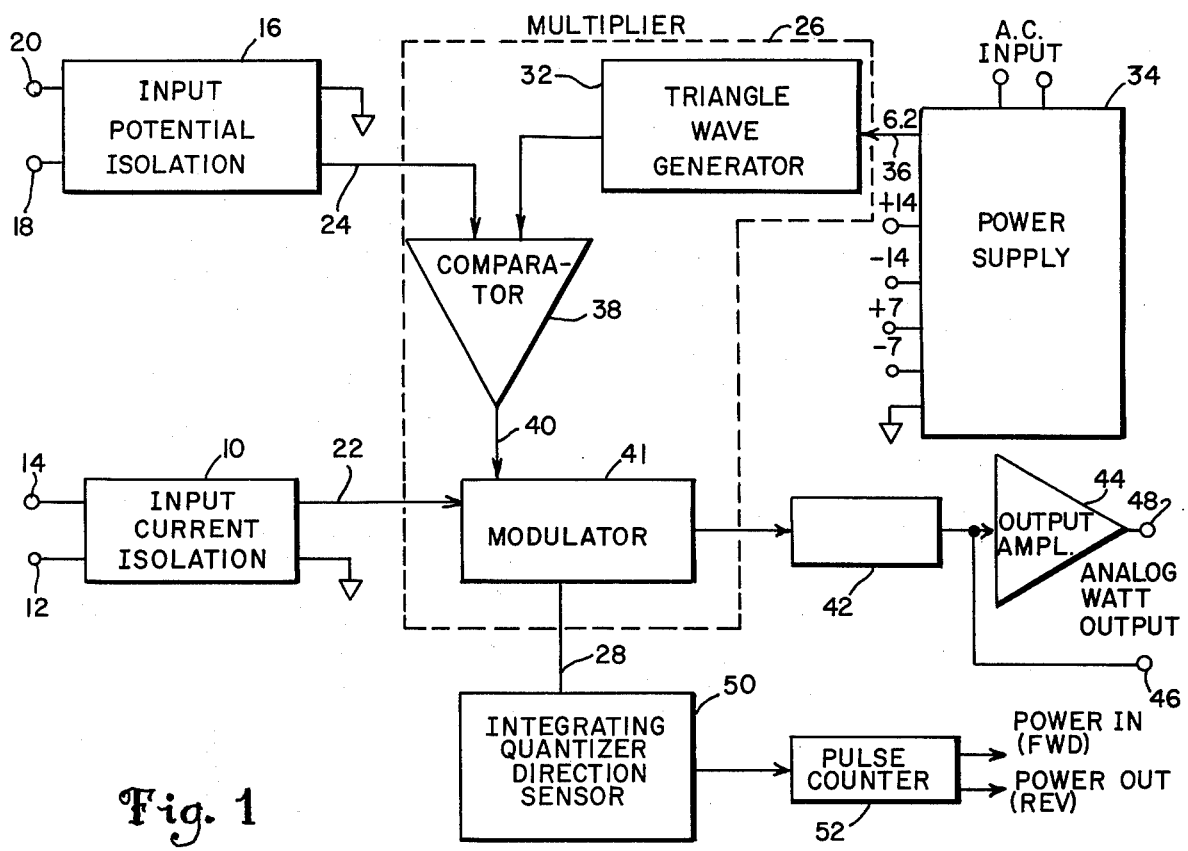
FIG. 1 is a block diagram of a complete watt/watthour transducer.

In describing the preferred embodiments of the invention illustrated in the drawings, specific terminology will be resorted to for the sake of clarity. However, it is not intended to be limited to the specific terms so selected and it is to be understood that each specific term includes all technical equivalents which operate in a similar manner to accomplish a similar purpose. For example, the terms "connected" or "coupled" may include connection through other circuit elements where such connection is recognized as equivalent and operates in essentially the same manner to accomplish the same purpose.

DETAILED DESCRIPTION

A watt/watthour transducer is a device for sensing the voltage and current in a power line, multiplying the voltage and current to obtain a watt output signal, and integrating a watt signal to provide a watthour output signal. Of course, when there is a power factor involved the multiplication must also include the cosine of the phase angle between the voltage and current.

FIG. 1 is a block diagram of the basic components of a watt/watthour metering system. Although FIG. 1 embodys the present invention the figure is so simplified that it differs very little from similar prior art systems.

Referring to FIG. 1, the system is isolated from the power line by means of an input scaling means connected to the power line and includes a current scaling means 10 having input terminals 12 and 14 which are series connected to the power line and a voltage scaling means 16 having input terminals 18 and 20 which are shunted across the power line. In this manner, a signal proportional to power line current is provided at the output 22 of the current scaling means 10 and a signal proportional to power line voltage is provided at the output 24 of the voltage scaling means 16.

Voltage scaling means 16 preferably comprises a potential input transformer which scales the power line voltage downward by a ratio of 120 to 1.4 to provide a nominal secondary voltage of 1.4 volts rms at the output 24 which is a replica of the power line voltage at the terminals 20 and 18. The input scaling means 10 preferably comprises a current transformer which typically scales the current down by a factor of 1000 to 1. Consequently, a 5 amp power line current would produce a 5 milliamp output current through the output 22 of the current scaling means 10.

These current and voltage signals are applied to a multiplier circuit 26 which in turn provides a signal proportional to power line power at multiplier outputs 28 and 30. The preferred multiplier circuit accomplishes multiplication by means of pulse width modulation. In this system, the voltage or current signal is modulated by the other to provide an output train of pulse with amplitudes proportional to the amplitude of the modulated signal and a pulse width duration proportional to the modulating signal. The average value of this pulse train is proportional to power through the power line.

The preferred multiplier utilizes a triangle wave generator 32 referenced to a reference voltage derived by a power supply 34 at power supply output 36. The multiplier has a comparator 38 which compares the output of the triangle wave generator 32 with the scaled voltage signal at the output 24 of the voltage scaling means 16. The comparator output signal is applied as a modulating voltage to a chopper modulator to modulate the scaled current signal from the output 22 of the current scaling means 10.

The triangle wave generator 32 develops a triangle waveform which is preferably approximately 5.9 volts peak to peak and centered around ground. The scaled voltage signal is compared to the signal from the triangle wave generator 32 resulting in a pulse train from the comparator output 40 having an average frequency equal to the frequency of the triangle wave which is preferably approximately 600 Hz. The width of these pulses is proportional to the input voltage from the power line and their amplitude is of no consequence because the pulses are used to switch the chopper modulator 41. Thus, the triangle wave generator and comparator function together as an analog to pulse width convertor.

Multipliers of this general type for providing a single output which has an average value proportional to the power through the power line are known in the art having for example, been described in U.S. Pat. No. 3,794,917. Consequently, further details are unnecessary as to the description of its operation. It might however, be preliminarily noted that most such prior art devices either provide a voltage output signal which consequently may be sent by means of outputs 28 and 30 to other portions of the circuit or they provide a single output current signal.

In this manner, pulses are derived having an amplitude proportional to power line current and a pulse width proportional to power line voltage. These are conventionally applied to a filter 42 and an output amplifier 44 in order to obtain a smooth continuous average dc signal proportional to the power through the power line and to provide a high output impedance current source to apply current through some desired watt output load such as a recording or readout device or to some control system utilizing watt information connected at terminals 46 and 48.

The output 28 from the chopper modulator 41 applies the same watt related pulse train to a circuit for integrating the watt related signal with respect to time in order to provide a total energy or watthour output. Typically, this is done by an integrator-quantizer circuit 50 which consists of an integrator which integrates the pulse train analog signal from the output 28 of the chopper modulator 41 and also performs an analog to digital conversion function by quantizing the integrated signal into a series of digital pulses. These digital pulses are then counted by a pulse counter 52 consisting of, for example, suitale counting registers. It might also be noted that the power supply of applicant's system may be a relatively conventional power supply providing 5 output voltages. These voltages are +−14 volts for the op-amps, +−7 volts for the chopper modulator and a +6.2 volt reference which is derived from a zener voltage reference diode.

Applicant has discovered that errors due to offset voltage, drift and other voltage related voltage errors which detract from accuracy can be very substantially reduced by maintaining a current signal from the modulated signal input 22 through the chopper modulator 41 all the way through the watt output load connected at terminals 46 and 48 and through the integrator to the point where the watthour signal is integrated and converted to digital pulses. This has been done by constructing the chopper modulator, filter and output amplifier 42 and 44 and integrating quantizer 50 in such a way that a continuous current path extends through all these elements.

A high impedance current source is developed from one of the input scaling means 10 and 16. The preferred high impedance current source is a current scaling means comprising a current transformer since such a transformer presents a high impedance current source at its secondary.

The chopper modulator 41 is a switching means operated as a pulse width modulator and is connected to the high impedance current source to modulate that current source with the signal derived from the voltage scaling means through the comparator 38. In this manner, the output of the chopper modulator 41 is a plurality of current pulses having an instantaneous amplitude equal to the ampltiude of the instantaneous signal from the high impedance current source and having a pulse width proportional to the instantaneous amplitude of the voltage signal.

Of course, it is also important that the pulse width modulating switching means have substantially no current path which is capable of shunting any average current from the current being modulated which would bypass the circuits at the output of the switching means and that no substantial gate current be inserted from the control input or gate of the switching means. For these reasons, the preferred switching means is comprised of complementary MOS/FET gating devices.

Of course, the invention claimed in this application is not limited to the preferred modulator or other circuits disclosed. Furthermore, the invention may be used in circuitry other than watt/watthour transducers. The features of the present invention may also be taken advantage of in a conventional watthour transducer using a conventional multiplier with the integrator circuit of the present invention utilized to integrate the multiplier output signal with respect to time to derive a watthour output.

1. PRECISION STANDARD CURRENT SOURCES

In order to obtain an integration of the current signal which is proportional to instantaneous power through the power line, it will become apparent that it is desirable to provide a pair of precisely equal standard current sources for use in the integration-quantizing circuitry. Applicant has discovered circuitry for providing such sources and this is next described. It should be understood however, that circuits embodying this invention will be found useful in other types of circuitry.

Figure 2:
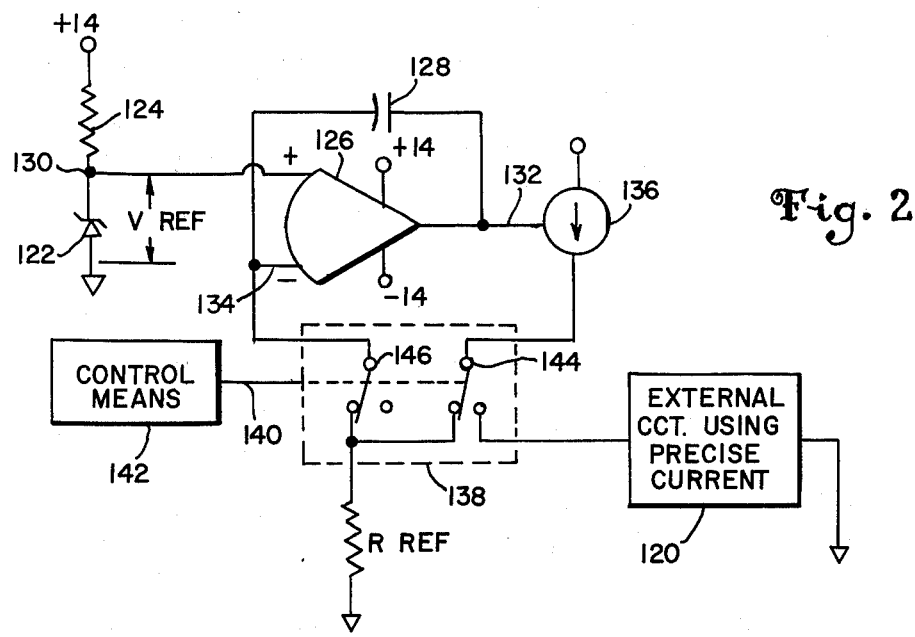
FIG. 2 is a simplified schematic drawing of a single standard precise current source enbodying the present invention.

FIG. 2 illustrates a basic simplified precision standard current source embodying the present invention for occasionally supplying to an external circuit 120, which is connected to a common ground, a current pulse having a selected standard magnitude. The standard current source circuit is referenced to a reference voltage $V_{ref}$ which may be derived from a series zener voltage reference diode 122, erased by resistance 124 connected to the power supply.

An op-amp 126 and capacitor 128 form a conventional op-amp intergrator means. The non-inverting input of the op-amp integrator is connected to the voltage reference terminal 130 and the integrating feedback capacitance 128 is connected between the output 132 of the integrator and the inverting input 134 of the op-amp 126. A controllable current source 136 is connected to the output 132 of the op-amp integrator circuit so that the current of the current source 136 is dynamically controlled by the op-amp integrator. A reference resistance $R_{ref}$ has a first one of its terminals connected to the common ground.

The purpose of this integrator is to integrate the voltage at its input with respect to time. Consequently, other integrator circuits could be used. For example, the integrator means might comprise a comparator and a conventional RC integrating circuit or other combinations of functional elements to accomplish the same operation.

A double-pole, two-state switching means 138 connects these elements together and has a control port 140 which is connected to a control means 142 for switching the states of the switching means 138 as subsequently described.

The wiper terminals 144 and 146 of the switching means 138 are connected respectively to the current source 136 and the inverting input 134 of the op-amp integrator means. The other terminals of the switching means 138 are connected as indicated so that in one state of the switching means 138 both the current source 136 and the inverting input 134 of the op-amp integrator circuit are connected to the non-grounded terminal of the reference resistance $R_{ref}$.

In the other state of the switching means 138, both the current source 136 and the inverting input 134 are disconnected from the reference resistance $R_{ref}$ and the current source is connected to the external circuit 120 which utilizes the precise current pulse. The inverting input 134 is disconnected in order to disable the integrating means from performing it integrating function. However, the switch means could be effectively connected in other ways to accomplish this same purpose.

In the operation of the circuit in FIG. 2 the circuit begins with the switching means 138 in the state illustrated in FIG. 2. This will cause the voltage across the reference resistance $R_{ref}$ to be brought by the circuitry to essentially the same voltage as appears across the zener diode 122 and is equal to $V_{ref}$. The current through the resistance $R_{ref}$ will therefore be equal to $V_{ref}$ divided by $R_{ref}$. The purpose of this circuit is to provide current pulses having a magnitude equal to $V_{ref}$ divided by $R_{ref}$.

This current magnitude is quickly reached by the circuit. When the circuit is initially energized, the inverting input 134 of the op-amp 126 will begin at essentially zero volts while the non-inverting input of the op-amp 126 will be quickly brought to $V_{ref}$. This will in turn immediately cause the output 132 of the op-amp 126 to begin increasing very rapidly in the positive direction. As this occurs, current will begin flowing from the output 132 of the op-amp 126 through the capacitance 128 and through the reference resistance $R_{ref}$. Simultaneously, the increase of the output voltage of the op-amp 126 will begin increasing the current flow provided by the current source 136.

In this manner, the op-amp integrator circuit will continue integrating the difference between the voltage $V_{ref}$ and the voltage across $R_{ref}$ until the two are substantially equal. When such an equilibrium steady state condition is reached, the entire current through $R_{ref}$ will be provided by the current source 136. Therefore the voltage on the reference resistance $R_{ref}$ will be maintained substantially identical to the reference voltage $V_{ref}$. Consequently, a precision current will be provided by the current source 136 to within the tolerances of the voltage reference diode 122 and the reference resistance $R_{ref}$.

This current source can occasionally be borrowed by the external circuit 120 by operation of the control means 142 to switch the switching means 138 to its other state. However, while the current source 136 is switched into the external circuit 120, it is essential that the integrator means be disabled so that its output does not significantly vary. In the preferred embodiment the inverting input 134 of the op-amp 126 is disconnected from the circuitry so that it will not be connected to a voltage which is different from $V_{ref}$.

If the inverting input 134 were connected momentarily to a voltage different from $V_{ref}$, and the integrator means were not disabled, it would immediately begin integrating the dirrerence between $V_{ref}$ and this other voltage and change the current through the current source 136. However, by disconnecting the inverting input 134 and permitting it to float, the inverting input 134 will be maintained for a substantial length of time at the same potential which existed prior to its disconnection from reference resistance $R_{ref}$.

Consequently, it can be seen that the precise current source 136 may be borrowed for a length of time which is short relative to the discharge time constant for the discharging of capacitance 128. This discharge time constant will be extremely long since discharging current must flow through the extremely high input impedance of the inverting input 134 of the op-amp 126.

After the time interval of the precise current pulse, the switching means 138 is returned to the position illustrated in FIG. 2 and the circuit returns to its former equilibrium.

One of the primary advantages of a current source embodying the present invention is that it may be used to provide a current source which has two outputs each providing output currents which are identical in magnitude because they are referenced to a single reference voltage. This is termed a commonly referenced bipolar current source. By utilizing two circuits similar to that of FIG. 2, the circuit of FIG. 3 can be developed to provide a current pulse having a selected standard magnitude and flowing in either one of two opposite flow directions. Therefore, effectively, two different current sources are available to external circuitry each putting out a current pulse exactly equal in magnitude to the current pulse provided by the other but each providing its current pulse in opposite directions. These two current sources are maintained identical in magnitude because both are referenced to the same reference voltage $V_{ref}$ and to the same single resistance $R_{ref}$. Not only are two identical current sources available but both can be sunk to ground; that is, the external circuitry utilizing both current sources may be connected between an output terminal and ground.

Figure 3:
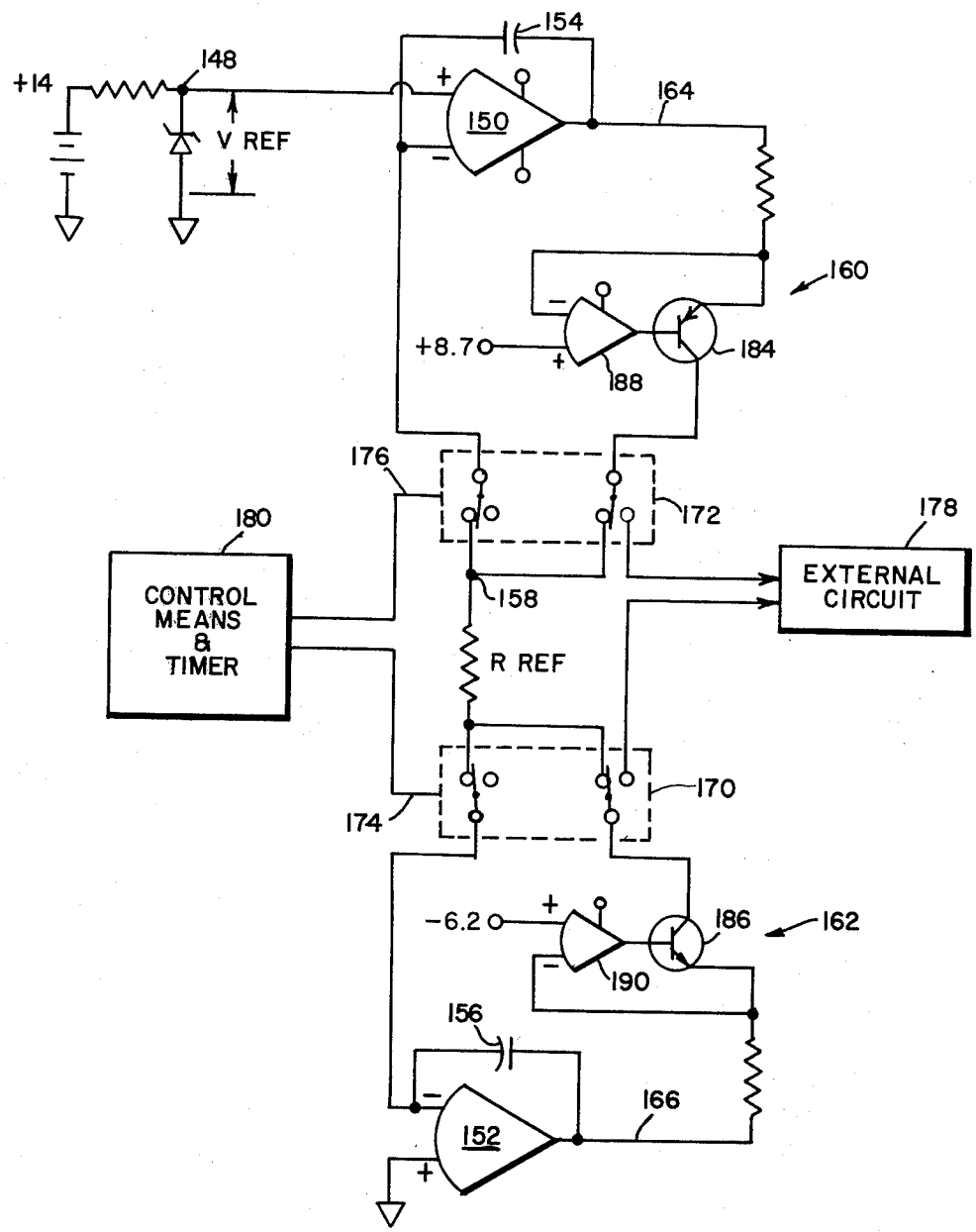
FIG. 3 is a schematic diagram of a bipolar current source embodying the present invention.

The circuit of FIG. 3 like the circuit of FIG. 2 utilizes a single voltage reference means for developing a precise reference voltage $V_{ref}$ between a reference voltage terminal 148 and the common ground.

This circuit has a pair of differential input op-amp integrator circuits, one utilizing op-amp 150 and the other utilizing op-amp 152. Each op-amp integrator circuit has its integrating feedback capacitance 154 and 156 respectively connected between its output and its inverting input. The non-inverting input of the op-amp 150 is connected to the reference voltage terminal 148 to integrate the difference between the reference voltage and the voltage at one terminal 158 of the reference resistance $R_{ref}$.

The non-inverting input of the other op-amp 152 is connected to the common ground to maintain the opposite terminal of $R_{ref}$ at virtual ground.

A pair of complementary controllable current sources, indicated generally as 160 and 162, are each connected to a different one of the outputs 164 and 166 of the op-amps 150 and 152 respectively. The current of each of the current sources 160 and 162 is dynamically controlled by the op-amp to which it is connected in the same manner that the current source of FIG. 2 is controlled by its associated op-amp.

These current sources 160 and 162 are termed complementary because their currents flow in opposite directions relative to the common ground. They are directed so that in the series connection of both sources with $R_{ref}$, both generate current flow in the same direction through $R_{ref}$.

The circuit of FIG. 3 further has a pair of double-pole, two-state switching means 170 and 172. Each having a control port 174 and 176 respectively. The switching means 172 is associated with the op-amp integrator circuit utilizing op-amp 150 and its connected current source 160 in the same manner that the switching means 138 of FIG. 2 is associated with the op-amp 126 and current source 136. Similarly, the switching means 170 is associated with op-amp 152 and its connected current source 162. Each of these switching means 170 and 172 has a first state for connecting the inverting input of its associated op-amp integrator circuit and the current source associated therewith to one of the terminals of the reference resistance $R_{ref}$. Each of the switching means 170 and 172 also have a second state for disconnecting its associated op-amp integrator and current source from the reference resistance for simultaneously connecting its associated current source to the external circuitry 178.

As with the single current source, the preferred circuit disconnects the input to the integrator means in order to disable the integrator means. With the bipolar source, both integrator means must be disabled when either current source is borrowed. They could be disabled in any alternative manner.

Preferably, therefore, the switching means 170 and 172 together have three states. One state in which the integrator and current sources are connected to opposite ends of the reference resistance. There are second and third alternative states where one or the other of the current sources 160 or 162 is disconnected from the reference resistance and connected to the external load. In both the second and the third states both integrator means are disabled.

The switching means 170 and 172 are controlled at their respective control input ports 174 and 176 by a control means 180. This signal control means 180 advantageously includes a precision timer for controlling the pulse width of the precise standard current output pulses.

Therefore, it can be seen that the circuit of FIG. 3 in effect comprises a pair of complementary current sources like that illustrated in FIG. 2, one connected to each end of the reference resistance $R_{ref}$. One is referenced to the reference voltage $V_{ref}$ and the other is referenced to ground and they provide complementary current sources occasionally connectable to the external circuitry 178.

The two current sources in more detail each comprise one of two complementary bipolar transistors 184 and 186 having its emitter resistively coupled to the output of its associated op-amp integrator circuit and its collector coupled to its associated switching means.

The transistors 184 and 186 are controlled in the conventional manner by differential input op-amps 188 and 190 each having its output connected to the base of its associated transistor, its inverting input connected to the emitter of the transistor and its non-inverting input connected to a reference voltage in the conventional manner.

2. BI-DIRECTIONAL INTEGRATOR

Figure 4:
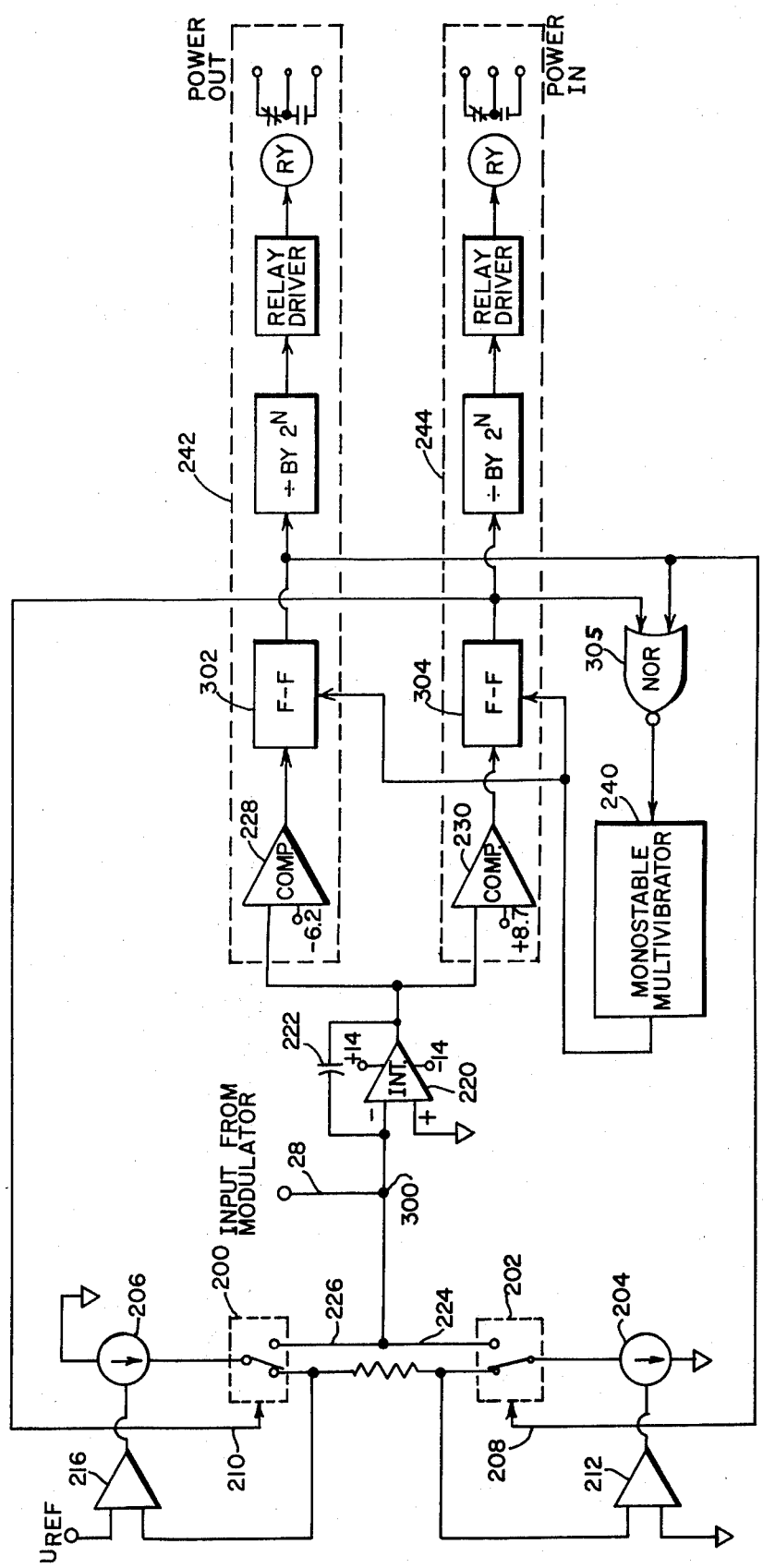
FIG. 4 is a diagram of the integrating and quantizing watthour section of a watt/watthour transducer embodying the present invention.

The bi-directional integrator of the present invention is illustrated in FIG. 4. It utilizes a bipolar standard current source like that illustrated in FIG. 3. However, in FIG. 4 the bipolar current source has been simplified for purposes of illustration. It is illustrated as a pair of switching means 202 and 200 each associated with a current source 204 and 206 and each having a control input 208 and 210 respectively. The current sources are controlled by integrators 212 and 216 respectively as described above.

A differential input op-amp 220 is connected in an integrator circuit having the non-inverting input connected to the common ground and its integrating feedback capacitor 222 connected between its output and its inverting input. Both current output terminals 224 and 226 of the bipolar current source are connected to the inverting input 300 of the integrator circuit of op-amp 220. Also connected to the same inverting input 300 is the watt related signal from the multiplier. In this manner, the watt signal is applied to the integrator-quantizer of the watthour section of the watt/watthour transducer.

A pair of comparators 228 and 230 each have one of their inputs connected to the output of the integrator circuit op-amp 220. One of the comparators 228 is referenced to a −6.2 voltage for switching the output state of the comparator 228 from its first state to its second state when the output of the integrator circuit op-amp is less than −6.2 volts. The other comparator 230 is referenced to a +8.7 volts for similarly switching its output state when the output of the integrator circuit op-amp 220 exceeds +8.7 volts.

The outputs of the comparators 228 and 230 are then applied to other logic and timing circuit elements which in turn are connected back to control the switching means 200 and 202 of the bipolar current source. The bipolar current source in effect has three states. It has a first state for supplying no current at all, a second state for supplying a precise current pulse in one current flow direction and a third state for supplying a precise current pulse in the opposite flow direction.

The purpose of the logic and timing circuit means is first to switch the bipolar current source to its first state when the output of the integrator 220 is intermediate −6.2 volts and +8.7 volts. When the output of the integrator circuit of op-amp 220 minimally exceeds −6.2 volts, the logic and timing circuit elements switch the bipolar current source to whichever of its second or third states provides a current which reduces the charge on the integrating feedback capacitance 222 and thereby reduces the output voltage of the watt integrator.

The circuit utilizes a quartz referenced monostable multivibrator 240 for controlling the pulse width of the precise current pulses. Reverse and forward counting circuits 242 and 244 respectively are connected to the logic and timing circuit means for counting output pulses the number of which represent the integrated total of energy in watthours.

The operation of the circuit illustrated in FIG. 4 may now be considered.

In the operation of the circuit illustrated in FIG. 4, current pulses arrive at the input 28. The average value of these current pulses is proportional to the instantaneous power in the power line being metered. Consequently, the function of the circuit of FIG. 4 is to integrate the average value of these pulses with respect to time to provide a watthour output.

These incoming current pulses arrive at the inverting input of the integrator op-amp 220. This input 300 operates as a current summing point so that, with multi-phase metering equipment each phase may have its own current and voltage scaling transformers and multipliers, the outputs of which are applied to this summing point.

Each incoming current pulse represents a quantum of charge which will be charged upon the capacitance 222 of the integrator. The current flow direction of these incoming pulses will be in one of two opposite directions representing either forward or reverse power flow through the power line.

As charge accumulates upon the integrating capacitance 222, the voltage output level of the op-amp 220 will swing either in a negative direction or a positive direction depending upon the current flow direction of the incoming pulses.

If the incoming pulses cause the output of op-amp 220 to swing in the negative direction the swing will continue until it reaches −6.2 volts. Upon exceeding −6.2 volts, the output voltage of the op-amp 220 will switch the states of the comparator 228 which causes the flip-flop 302 to be set.

The switching of the flip-flop 302 to its set state in turn switches the switching means 202 so that the standard precise current of current source 204 is applied to the summing point input 300 of the integrator.

Simultaneously with the switching of the flip-flop 302 to its set state, a quartz referenced monostable multivibrator 240 is switched through norgate 305 to begin a timing cycle. At the end of this precise timing cycle the flip-flop 302 is reset by the multivibrator 240 and consequently the switching means 202 is returned to its integrating position as illustrated in FIG. 4.

This set and subsequent reset of the flip-flop 302 produces a voltage pulse at its output which may be counted by the counting circuitry 242.

During the time the precise current source 204 was applied to the input 300 of the integrator, it removed or added charge from the integrating capacitance 222. This means that the bipolar sources 204 and 206 are arranged so that if current pulses at the input 28 from the modulator add charge to the capacitance 222 at one polarity then the bipolar current source subsequently connected to the summing point input 300 will move charge in the opposite direction.

Therefore the capacitance 222 of the integrator functions somewhat analogously to a large container into which small quantities of material are periodically poured. Each time the level of material reaches a selected level a precise large quantity of material is removed. Unlike this mechanical analog, the present invention is bi-directional.

In the circuit of FIG. 4, the precise quantity of charge removed from the capacitor is proportional to a precise quantity of energy flowing through the power lines. Consequently, the counting circuit 222 effectively counts the number of times that the precise quantity of charge is removed from the capacitance 222 and this is easily correlated to total watthour energy flow.

Of course, incoming current pulses of the opposite direction which make the output of the op-amp 220 rise toward a positive voltage level will eventually switch the state of the comparator 230 and cause a similar set and reset of the flip-flop 304. The flip-flop 304 in turn causes a precise current pulse to flow through the summing input 300 of the integrator and having an amplitude determined by current source 206 and a duration determined by the quartz referenced multivibrator 240.

Each current pulse from the current source 206 represents the same precise quantum of charge which is proportional to the energy flow through the power line. Consequently, the counting circuitry 244 can count the number of times this precise quantity of charge is moved to the capacitor 222 and obtain an output proportional to total watthours.

The voltage levels at which the removal of a quantum of charge is initiated is not significant nor would the occurence of voltage drift be significant. This is because the quantum of charge is always identical if the current magnitude and pulse width of the pulses from the bipolar source are always the same. Therefore voltage level plays no analog metering role, the metered quantities being, current in the form of a flow of a discrete charge quantum and the number of such discrete charge quanta.

Figure 5:
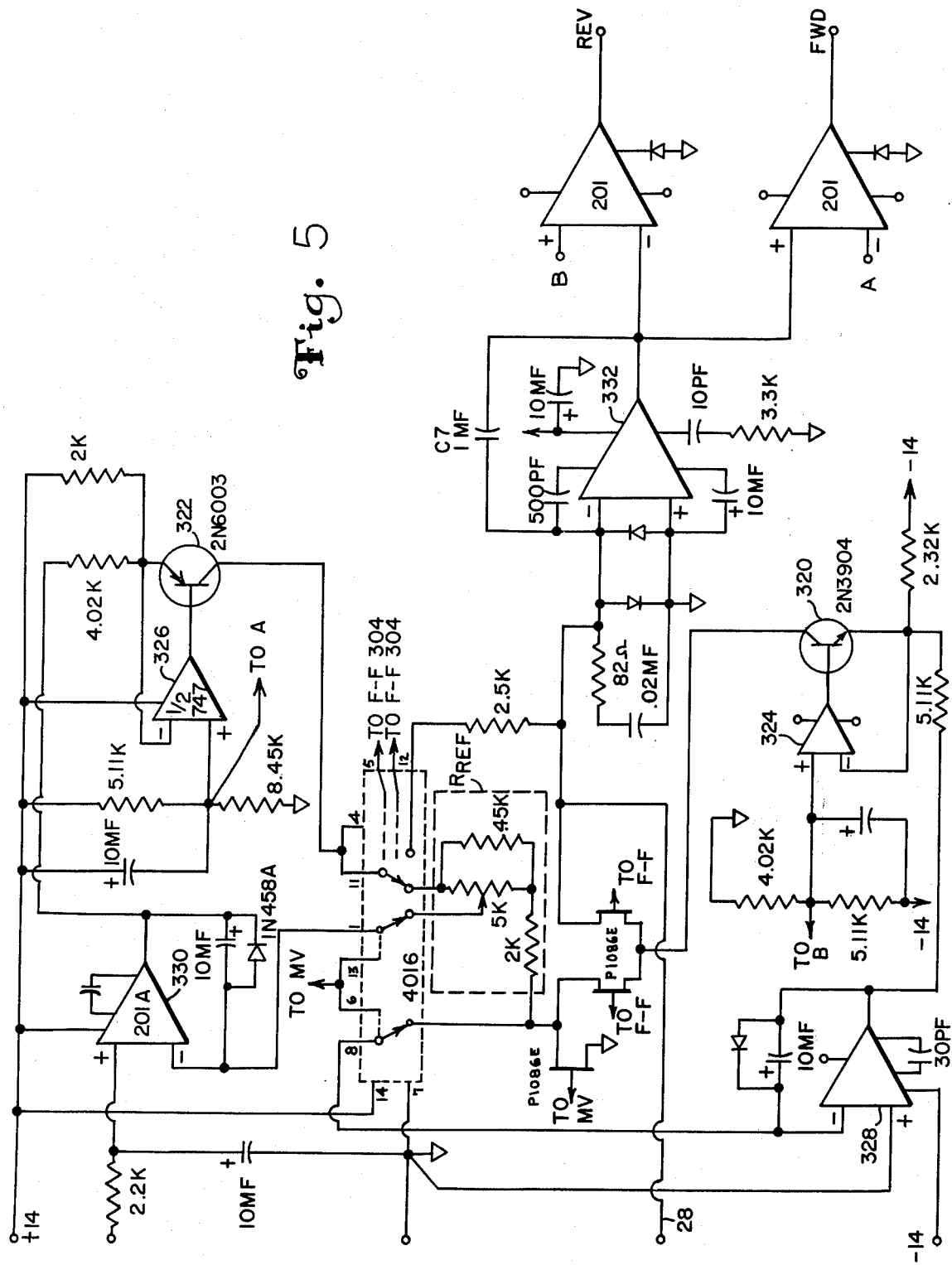
FIG. 5 is a schematic diagram of a portion of the preferred integrator and quantizer of the present invention.

FIG. 5 represents the details of the preferred embodiment of the invention. Complementary bipolar transistors 320 and 322 along with their op-amps 324 and 326 provide the controlled current sources of the bi-polar current source described above.

Op-amps 328 and 330 represent op-amps 152 and 150 of FIG 3. Op-amp 322 corresponds to op-amp 220 of FIG. 4, while capacitance C7 corresponds to capacitance 222 of FIG. 4.

The reference resistance $R_{ref}$ comprises several resistances as illustrated on the diagram. The correspondence of other components is believed to be obvious to those skilled in the art and consequently further discussion is deemed unnecessary since FIG. 4 illustrates the principles of the present invention.

It is to be understod that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

What is claimed is:

1. A bi-directional integrator quantizer circuit comprising:
   a. an integrating circuit means for integrating a signal applied to its input with respect to time by accumulating electric charge;
   b. a bipolar current source for at time supplying to said integrating circuit, a current pulse having a selected standard magnitude and in either one of two opposite flow directions, said source comprises;

i. means for developing a precise reference voltage between a reference voltage terminal and a common;
ii. a reference resistance;
iii. a pair of integrator means each for integrating the voltage at its input terminals with respect to time, an input terminal of one integrator means connected to said reference voltage terminal and an input terminal of the other integrator means connected to said common;
iv. a pair of complementary controllable current sources each coupled to the output of a different one of said integrator means for dynamic control of the current of said sources by its associated integrator means; and
v. a switching means having at least three states for connecting one current source and the other input terminal of its associated integrator means to one terminal of said reference resistance and connecting the other current source and the other input of its associated integrator means to the other terminal of said reference resistance in one state, for alternatively disconnecting one of said current sources from said reference resistance and connecting the disconnected current source to said integrating circuit in second and third states, and for disabling both integrator means from performing their integration function in both said second and third states;

c. a pair of comparators each having one of its inputs connected to the output of said integrating circuit means, one of said comparators referenced to a first voltage for switching its output from a first state to a second state when the output of the integrating circuit means reaches a selected positive output voltage and the other of said comparators referenced to a second voltage for switching its output from a first state to a second state when the output of the intergrating circuit means reaches a selected negative voltage; and d. logic and timing circuit means having a pair of inputs connected to the outputs of said comparators and connected at its output to the switching means of said bipolar current source for switching said switching means to its first state when both of said comparators are in their first state, and for switching the switching means for a precise selected time period to whichever one of its second or third states provides a current which reduces the accumulated charge of said integrating circuit means and thereby reduces the output voltage of said integrating circuit means.

2. An electrical power line watthour metering apparatus of the type including a pair of watt related signal terminals providing a signal which is directly proportional to the instantaneous power of said power line and an integrator-quantizer means for integrating said watt signal over a selected period of time for providing an output signal corresponding to watthours of energy through said power line, wherein the improvement comprises a bi-directional integrator-quantizer comprising;

a. a commonly referenced bipolar current source for supplying a current pulse having a selected standard magnitude and in either one of two opposite current flow directions, said bipolar current source including a switching means for selectively switching said current source to a first state supplying no current, to a second state supplying a pulse in one current flow direction and a third state supplying a pulse in the opposite current flow direction;

b. an integrating circuit means having an input connected to said watt signal terminals for integrating said watt related signal with respect to time by accumulating charge and also having its input connected to the output of said bipolar current source;

c. a pair of comparators each having one of its inputs connected to the output of said integrating circuit means, one of said comparators referenced to a first voltage for switching its output from a first state to a second state when the output of the integrating circuit means reaches a selected positive output voltage and the other of said comparators referenced to a second voltage for switching its output from a first state to a second state when the output of the integrating circuit means reaches a selected negative voltage; and d. logic and timing circuit means having a pair of inputs connected to the outputs of said comparators and connected at its output to the switching means of said bipolar current source for switching said current source to its first state when both of said comparators are in their first state, and for switching the switching means for a precise selected time period to whichever one of its second or third states provides a current which reduces the accumulated charge of said integrating circuit means and thereby reduces the output voltage of said integrating circuit means.

3. An apparatus according to claim 2 wherein said commonly references bipolar current source comprises:

a. means for developing a precise reference voltage between a reference voltage terminal and said common;
b. a reference resistance;
c. a pair of integrator means for integrating the voltage at its input terminals with respect to time, an input terminal of one integrator means connected to said reference voltage terminal and an input terminal of the other integrator means connected to said common;
d. a pair of complementary controllable current sources each coupled to the output of a different one of said integrator means for dynamic control of the current of said sources by its associated integrator means; and
e. a switching means having at least three states for connecting one current source and the other input terminal of its associated integrator means to one terminal of said reference resistance and connecting the other current source and the other input of its associated integrator means to the other terminal of said reference resistance in one state, for alternatively disconnecting one of said current sources from said reference resistance and connecting the disconnected current source to an external load in second or third states, and for disabling both integrator means from performing their integration function in both said second and third states.

4. A bipolar source according to claim 3 wherein said integrator means comprises a pair of differential input, op-amp integrator circuits, each having an integrating feedback capacitance connected between its output and its inverting input, the non-inverting input of a first one of said op-amp integrator circuits being connected to said reference voltage terminal and the non-inverting input of the second of said op-amp integrator circuits being connected to said common; and wherein said switching means comprises a pair of double pole, two state switching means each associated with one of said op-amp integrator circuits and its associated controllable current source, each switching means having a first state for connecting the inverting input of its associated op-amp integrator circuit and the current source associated therewith to a different one of the terminals of said reference resistance and each having a second state for disconnecting the inputs of both op-amp integrator circuits and its associated current source from said reference resistance and for simultaneously connecting its associated current source to said external circuit.

5. A source according to claim 4 wherein each of said current sources comprises:
  a. one of two complementary transistors having its emitter resistively coupled to the output of its associated op-amp integrator and its collector coupled to the associated switching means; and
  b. a differential input op-amp havng its output connected to the base of said transistor, its inverting input connected to the emitter of said transistor and its non-inverting input connected to a reference voltage.

* * * * *